United States Patent [19]
Katz et al.

[11] Patent Number: 5,191,338
[45] Date of Patent: * Mar. 2, 1993

[54] WIDEBAND TRANSMISSION-MODE FET LINEARIZER

[75] Inventors: Allen Katz, Trenton; Shabbir S. Moochalla, Kendall Park, both of N.J.

[73] Assignee: General Electric Company, East Windsor, N.J.

[ * ] Notice: The portion of the term of this patent subsequent to Aug. 6, 2008 has been disclaimed.

[21] Appl. No.: 800,375

[22] Filed: Nov. 29, 1991

[51] Int. Cl.$^5$ .......................... H04B 7/185; H03F 3/16
[52] U.S. Cl. .................................. 342/352; 330/277; 330/284
[58] Field of Search ............. 330/107, 110, 277, 286, 330/280, 284, 304; 333/81 R, 18, 28 R, 164; 307/501; 342/352, 353

[56] References Cited

U.S. PATENT DOCUMENTS

| | | | |
|---|---|---|---|
| 3,441,879 | 4/1969 | Tomcavage | 333/28 |
| 3,665,345 | 5/1972 | Dolby | 333/14 |
| 3,743,958 | 7/1973 | Horneff | 330/149 |
| 3,904,975 | 9/1975 | Satoh | 330/284 |
| 3,917,964 | 11/1975 | Carlson | 307/304 |
| 4,152,666 | 5/1979 | Kajikawa et al. | 330/277 |
| 4,843,358 | 6/1989 | Meise et al. | 333/263 |
| 4,849,710 | 7/1989 | Vo | 330/277 |
| 4,864,162 | 9/1989 | Maoz | 307/296.1 |
| 4,875,023 | 10/1989 | Maoz | 333/81 R |
| 4,967,169 | 10/1990 | Sun et al. | 333/28 |
| 4,988,949 | 1/1991 | Khanna | 331/117 |
| 5,038,113 | 8/1991 | Katz et al. | 330/277 |
| 5,039,873 | 8/1991 | Sasaki | 330/277 |
| 5,051,705 | 9/1991 | Moghe et al. | 330/277 |

OTHER PUBLICATIONS

Instr. Booklet, Jerrold SLE-300-2W.
"FETs as Voltage-Controlled Resistors", 1973, Siliconix, Inc.
"FETs as Voltage-Controlled Resistors", Aug. 1965, Sherwin.
Instr. Booklet Ca. Sep. 1967 Jerrold model SCON converter.
Jerrold instr. booklet May 1964, "Super-Cascader".
Jerrold instr. booklet Apr. 1973, Model 3880 Amplifier, Calif.
"Design Better AGC FET Amplifiers", Farell, pp. 66–71 Elec. Des. 18, Sep. 1, 1967.
"Low Cost, Low Drain, High Speed Wideband GaAs MMIC Switches", Fryklund et al, pp. 87–91 Dec., 1985 issue of Microwave Journal.
"Linearization Techniques for Travelling Wave Tube & Solid State Power Amplifiers", Kumar, undated article.
"Characterization of Linear and Nonlinear Properties of GaAs MES FETs for Broad-Band Control Applications", Guttman et al, pp. 81–85 of IEEE Transactions on Microwave Theory and Technique, May, 1987.

*Primary Examiner*—Gregory C. Issing
*Attorney, Agent, or Firm*—William H. Meise; Stephen A. Young; Clement A. Berard

[57] ABSTRACT

A FET is operated without source-to-drain bias, with the source-to-drain conductive path coupled in series with a transmission line. A gate-to-ground impedance is selected in conjunction with a gate voltage near pinch-off to impress nonlinear distortion or gain and/or phase of signals traversing the source-to-drain conductive path. The nonlinear distortion can compensate for the amplitude distortion of a following amplifier, but the phase distortion may not be suitable for correcting that of the following amplifier. An inductor is bridged from source to drain, and corrects the phase without excessive effect on the amplitude. The magnitude of the inductor may be adjusted to minimize nonlinear amplitude change without affecting the phase change, whereupon the phase change may be made independent of amplitude change. A resistor in series with the bridging inductor can be selected to render amplitude change independent of phase change. Two such independent amplitude and phase correctors may be cascaded.

16 Claims, 10 Drawing Sheets

WIDEBAND TRANSMISSION-MODE FET LINEARIZER

BACKGROUND OF THE INVENTION

This invention relates to distortion linearizers, and more particularly to FET distortion phase and/or gain linearizers.

Satellite communications systems are finding increasing use for inter-continental and intra-continental data and entertainment information transfers. The basics of such systems are by now common knowledge, and include earth stations for transmitting information to, and for receiving repeated or translated information from, a satellite, which is often geosynchronous. The high capital costs of communications satellites requires that the greatest possible use be made of their facilities, to lower the per-unit cost of communications. The severe operating environment in space, coupled with the inability to access the orbiting satellite to effect repairs, places stringent requirements on the systems and components of a satellite and its communication system payload. A plurality of communications channels are ordinarily provided, with enhanced channel-to-channel isolation by use of combined frequency and polarization diversity, as described in U.S. patent application Ser. No. 07/772,207, filed Oct. 7, 1991 in the name of Wolkstein. The information signal at the satellite must be amplified before retransmission back to earth for reception by an earth station. In principle, the information signals received at the satellite could be amplified by a single power amplifier. However, because of the linearity limitations of amplifiers which are available at the current state of the art for operation at the desired signal amplitude or power output levels, excessive intermodulation distortion occurs when multiple channels are processed in a single amplifier.

In order to maximize of the life of the satellite, the weight of every additional component must be assessed against the reduction in the useful lifetime of the satellite as a result of the reduced payload of expendable propellant (fuel or fuel-plus-oxidizer) which the component displaces. Thus, the tradeoffs of communications system performance versus weight are carefully evaluated. This evaluation is rendered complex because of other factors which must be considered, such as power consumption, reliability and payload performance.

As described by the aforementioned Wolkstein application, conventional communications systems use individual power amplifiers in each channel to reduce intermodulation distortion. However, some forms of distortion, such as phase distortion dependent upon instantaneous signal amplitude, and signal compression with increasing signal level, are not ameliorated by the single-channel amplifying technique. In order to maximize the output power from the power amplifier in each channel, the signal level is increased to a level at which significant distortion occurs, and a distortion corrector (often termed a pre- or post-equalizer) is added in the amplifier signal path.

Many different types of equipments termed balancers, compensators and equalizers are used in systems generally and in communications systems in particular. Thus, "balancers" may be weights used on rotating devices which reduce physical vibration, or may include a potentiometer connected to the electrodes of the tubes of a push-pull vacuum-tube amplifier to reduce harmonic distortion by making the tube's operating transfer functions as similar as possible. A "compensator" may be gas diverters affixed to the barrel of a small arm or cannon to reduce recoil, a magnet attached to compass, or it may be an electrical device, of which one example is a linear (nominally independent of amplitude) variable amplitude-versus-frequency (slope) device for maintaining constant gain in transmission-line systems such as cable television systems (CATV) in the face of different coaxial cable lengths or, when thermally controlled, in the face of performance variations caused by daily and seasonal temperature variations. Similarly, an "equalizer" may be a mechanical apparatus for distributing a load across several supports or an electric conductor joining various equipotential locations in a circuit. Also, "equalizer" is another term for a variable or thermal cable compensator, as described above. A bridged tee slope equalizer including complex reactive bridge networks is described in U.S. Pat. No. 4,967,169, issued Oct. 30, 1990 to Sun et al. A distortion equalizer corrects, in some way, for the distortion of an associated non-linear circuit. A "predistortion" equalizer is a non-linear apparatus, inserted in the signal path between a signal source and a non-linear apparatus such as a signal amplifier, for predistorting the signal in response to amplitude so that the amplitude andor phase distortion introduced by the following non-linear stage is wholly or partially cancelled. A post-distortion equalizer performs the same function at the output of the non-linear stage. Since the non-linear device for which compensation is required is usually a power amplifier, a post-distortion equalizer must handle higher signal amplitudes than a predistortion equalizer, for which reason predistortion equalizers are preferred.

As mentioned, satellite system tradeoffs are carefully evaluated in terms of power consumption, reliability, weight and performance. A great deal of attention has been directed to the tradeoffs between solid-state amplifiers and travelling-wave tubes as channel amplifiers for satellite communications, and at this time both are being improved and both types are currently used for frequency ranges from about 2 Gigahertz (GHz) to 13 GHz. Distortion equalizers include transmission schemes such as the dual-gate, common-source FET scheme described in U.S. Pat. No. 4,465,980, issued Aug. 14, 1984 to Huang et al, in which the signal is applied to one gate, and detected signal from a signal sample is applied to the other gate to generate the desired distortion. The signal sample is produced by a directional coupler. Directional couplers appear in other predistortion circuits, such as U.S. Pat. No. 4,109,212, issued Aug. 22, 1971 in the name of Donnell et al; U.S. Pat. No. 4,283,684, issued Aug. 11, 1981 in the name of Satoh; U.S. Pat. No. 4,564,816, issued Jan. 14, 1986 in the name of Kumar et al; and U.S. Pat. No. 4,588,958, issued May 13, 1986, in the name of Katz et al. These prior distortion equalizers have a salient disadvantage for satellite use, in that they use directional couplers. Such directional couplers are often designed as waveguide branch devices, which are assemblages of two parallel "through" waveguides, with a plurality of "branch" waveguides extending therebetween, which are dimensioned to produce the desired linear power division and linear phase shift. Such waveguide devices must have dimensions which are significant portions of a wavelength at the frequency of operation, and so they cannot be miniaturized. As a result, the waveguide directional coupler for a satellite predistortion equalizer, and possibly other components of some equalizers, tend to make each distortion equalizer bulky and heavy. This is particularly disadvantageous in multi-channel systems, because each channel includes a predistortion equalizer.

Reliability of satellite systems is enhanced by redundancy schemes. In many satellite communication systems, switched routing schemes allow high-priority signals to be routed to operative channels in the event of a channel failure. Among the system portions which are more likely to fail are the amplifiers. Consequently, redundancy schemes often involve switching the amplifiers among channels, together with supernumerary, ordinarily unused amplifiers, which can be switched into a channel to replace a failed amplifier. A concomitant of such a redundancy scheme is that each amplifier, and its associated distortion equalizer, must be capable of broadband frequency performance.

U.S. Pat. No. 5,038,113, issued Aug. 6, 1991 in the name of Katz et al, describes a transmission-type predistortion equalizer comprising an FET with its source-to-drain conductive path coupled in series with a transmission line, in contrast to the above-mentioned Huang et al common-source arrangement, and with a gate-to-ground reactance and gate bias selected to produce the desired level of distortion of the signals. In general, this transmission-type FET acts as a lossy transmission element, in which the loss decreases with increasing signal, to produce signal expansion. The signal expansion with increasing signal level offsets the signal compression occasioned by the associated amplifier. The phase shift through the transmission FET is also affected by the signal level. Several "modes" of operation of the Katz et al transmission FET distortion equalizer have been identified, which depend upon the gate bias voltage and the gate impedance. Three modes, each with about 5% bandwidth, have been identified, with both increasing and decreasing phase shift as a function of increasing signal level. A fourth mode provides gain expansion at frequencies below about 3 GHz with the FETs currently available. A fifth mode of operation is relatively broadband, and provides useful gain expansion at and above Ku-band (about 12 GHz). While this fifth mode of operation provides gain expansion in a region which is of interest at certain satellite communication frequencies, it provides phase shift which decreases (less time delay) with increasing signal power level, which may not be suitable for equalizing those amplifiers which have a similar phase distortion. To equalize distortion for those amplifiers subject to signal or gain compression together with decreasing phase shift in response to increasing signal power level, the distortion equalizer must have gain expansion coupled with phase shift which increases (more time delay) with increasing power level.

A copending patent application entitled, "Balanced Reflective Nonlinear Processor using FET," Ser. No. 07/753,164, filed Aug. 30, 1991 in the name of Katz et al, describes a reflective, balanced arrangement of transmission FET distortion generator operated in a reflective mode, which provides gain expansion together with increasing phase shift, as a function of increasing signal power level. This arrangement uses a coupler as part of the reflective balanced arrangements.

An improved distortion generator is desired.

SUMMARY OF THE INVENTION

A distortion generator includes an FET including a gate electrode and also including a controllable signal path extending between source and drain electrodes. The controllable path is coupled in a signal transmission path. The gate electrode is coupled to reference potential by a selected reactance, and is biased to provide the desired distortion of the signal traversing the controllable path. For use as a linearizer in conjunction with signal processors exhibiting gain compression together with decreasing phase shift in response to increases in signal level, an inductance is coupled across the controlled signal path of the distortion generator FET. The inductance provides a linear shunt path by which signal tends to bypass the FET path, principally when the FET path is in a high-impedance state, so the signal flows principally through the inductance. When the FET path has a low impedance, the effect of the inductance is reduced. In a particular embodiment of the invention adapted for use in the 11 to 13 GHz range, the inductance is provided by a discrete air-core solenoidal coil. In another embodiment of the invention, adjustment of phase control substantially independent of gain expansion control is provided by a resistance serially coupled with the inductance to form a series combination coupled between the source and drain electrodes of the FET. At a particular value of the resistance, the phase change in response to signal power level is approximately zero, and the FET distortion generator provides only gain expansion with increasing signal level. In yet another embodiment of the invention, two source-to-drain FET paths are cascaded, one of which is bridged by an inductance, the other by an inductance in series with a resistance. The resistance is selected to minimize phase change as a function of signal level, whereby the value of the corresponding inductance controls the amount of expansion in response to signal level changes. The FET bridged by an inductance then provides the phase change as a function of signal level. An intermediate amplifier may be used to maintain overall gain. In yet another embodiment, the bridging resistance is itself provided by the source-to-drain resistance of an FET. A variable capacitance associated with the bridging inductance controls the net bridging capacitance. The variable capacitance may be in the form of a varactor diode. In those systems in which the size or weight of hybrid couplers is not a problem, the bridged-inductance FET may be used in a reflective mode.

DESCRIPTION OF THE DRAWING

FIG. 9 is a plot of Carrier-to-Intermodulation (C/I) ratio versus backoff for the linearized TWTA of FIG. 8a;

FIG. 12b represents the impedance of the current of FIG. 12a;

DESCRIPTION OF THE INVENTION

Figure 1:
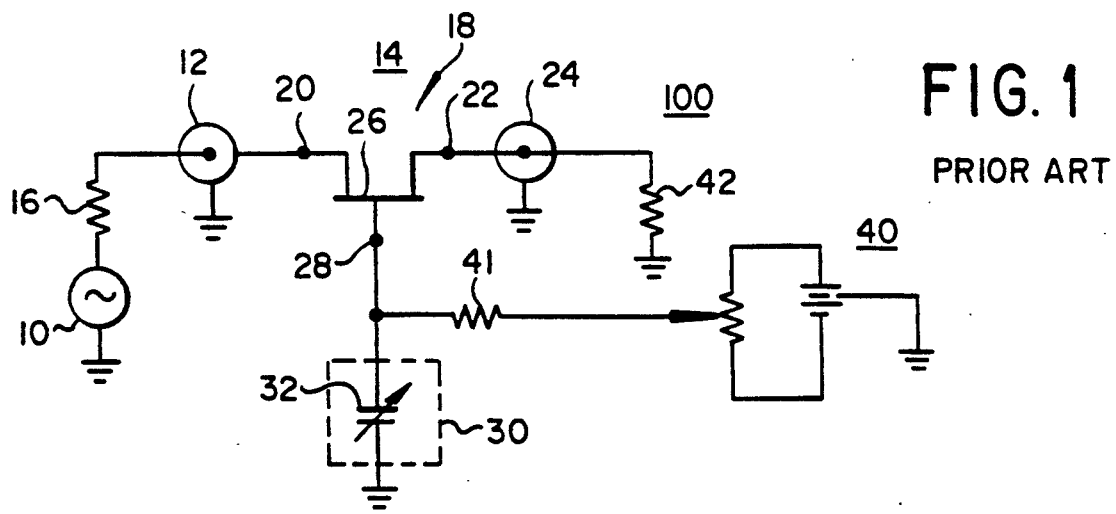
FIG. 1 illustrates the basic prior art FET distortion generator.

FIG. 1 is a schematic diagram of a prior art distortion generator as described in the above-mentioned Katz et al U.S. Pat. No. 5,038,113. In FIG. 1, a source 10 of alternating signal is coupled by a transmission line, illustrated by a coaxial transmission line symbol 12, to a distortion generator designated generally as 14. The impedance presented to the distortion generator is illustrated as a resistor 16, and depends, as known, upon the internal impedance of source 10 and the length, attenuation and characteristic impedance of transmission line 12. Distortion generator 14 includes a FET 18 having a source electrode 20 connected to transmission line 12, and a drain electrode 22 connected to an output transmission line represented by a coaxial transmission line symbol 24. A utilization device or load is represented by a resistor 42. A source-to-drain conductive path 26 extends between source electrode 20 and drain electrode 26, and its conduction is modulated or controlled by the voltage applied between a gate electrode 28 and conductive path 26. An impedance illustrated as a dashed block 30 is coupled between gate 28 and ground (or other reference potential, if desired). As illustrated within block 30, the reactance may be provided by a capacitor 32. However, as described in the aforementioned Katz et al patent, the net reactance between gate and ground is inductive because of path length consideration. A bias voltage source designated generally as 40 is coupled by an isolation or decoupling impedance or device represented as a resistor 41 to gate electrode 28, for biasing the FET to a region of desired nonlinearity. Those skilled in the art know that a resistor having a value of about 500 ohms or more may be suitable for decoupling in the circuit of FIG. 1, and also for providing current limiting, and that series radio frequency chokes (RFCs) may be used instead if current limiting is not needed, and that shunt capacitors may be used on the side remote from the RF to aid in decoupling. Bias voltage source 40 applies voltage between gate electrode 28 and controllable path 26 by a path which includes isolation resistor 41 and either (or both) source impedance 16 and load impedance 42, and the ground connection.

Figure 2:
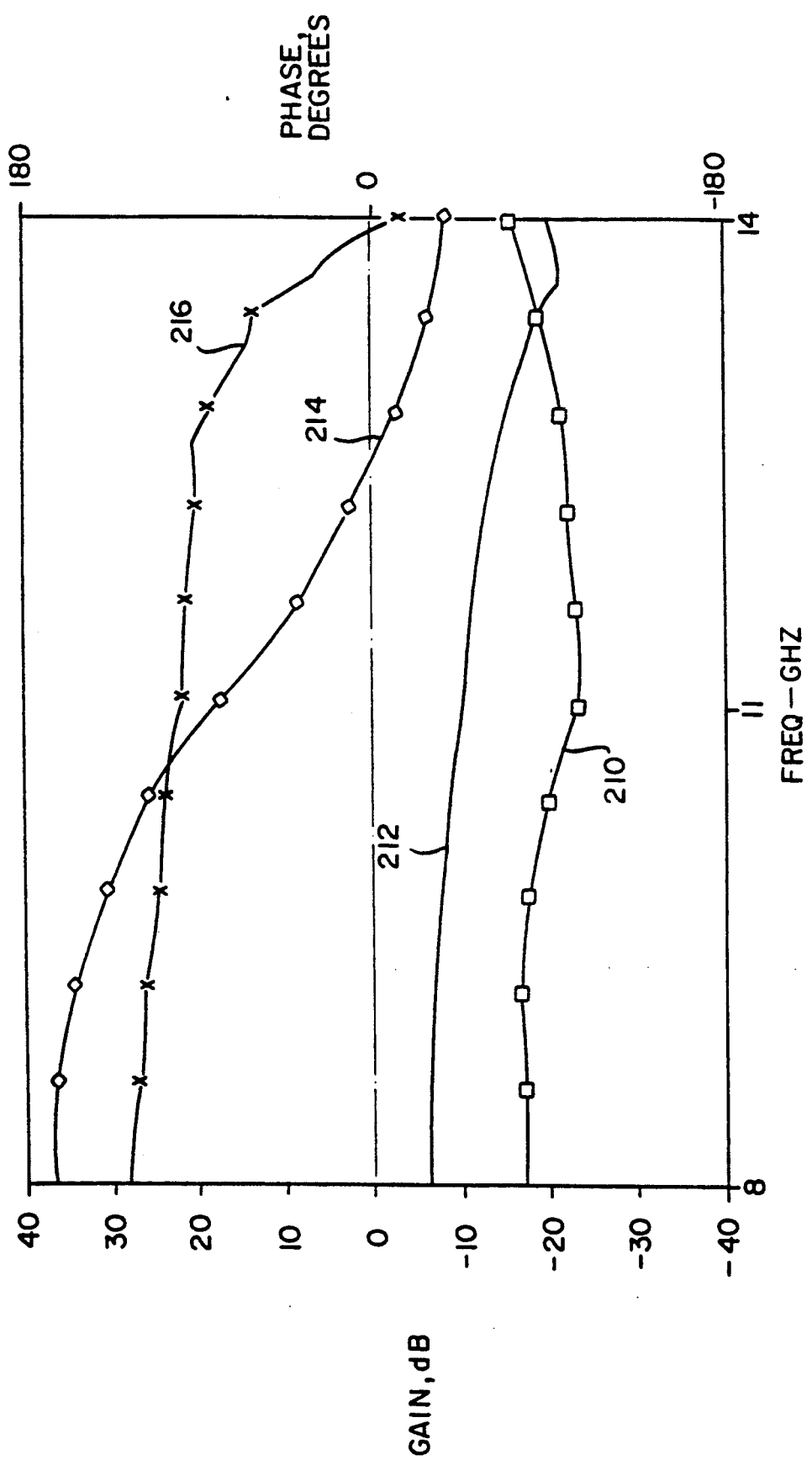
FIG. 2 plots computer-generated amplitude and phase responses as a function of frequency of the FET distortion generator of FIG. 1 in a particular operating mode, illustrating, as a function of increasing signal level, relative phase delay in one frequency range, and phase advance in another frequency range.

FIG. 2 plots modeled or calculated amplitude and phase response of FET distoration generator as a function of frequency, with signal input amplitude or level as a parameter, for the structure of FIG. 1 using a NEC type N673 FET. In FIG. 2, plot 210 represents the amplitude response or gain of the structure of FIG. 1 with 0.1 nanohenries (Nh) of inductance from gate to ground, at an input signal level of 0 dBm, and plot 212 represents the calculated gain response at the lower input signal level of −25 dBm. Plots 210 and 212 show negative gain, also known as loss. As illustrated, plots 210 and 212 converge at about 13 Ghz. Below about 13 Ghz, the amplitude response is about 5 to 15 dB greater at high signal levels than at low signal levels, thereby indicating a gain expansion by a like amount as a function of, or "with", increasing signal level. The response illustrated by plots 210 and 212 would provide gain expansion useful for correcting an amplifier's gain compression at frequencies from 8 Ghz (and possibly below) up to about 13 Ghz.

The calculated phase response of the structure of FIG. 1 at low input signal levels is illustrated by plot 214 in FIG. 2, and at high signal input levels by plot 216. As illustrated by plots 214 and 216 in the frequency range of about 11 to 14 Ghz, a phase advance (change in the positive-phase direction) occurs as the signal level increases from low to high levels while a phase lag occurs from 8 to about 11 Ghz. Clearly, such a response cannot correct over the complete frequency range 8 to 14 Ghz for an amplifier phase response which either advances (becomes more positive) or retards (becomes more negative) with increasing signal level. In particular, it cannot correct over the entire frequency range for an amplifier which experiences a retarding or decreasing phase shift with increasing signal level. Thus, even though the amplitude response or expansion as illustrated by plots 210 and 212 might be satisfactory over the frequency range of 8 to 13 Ghz, the phase response is not suitable for distoration correction of at least some amplifiers.

Figure 3:
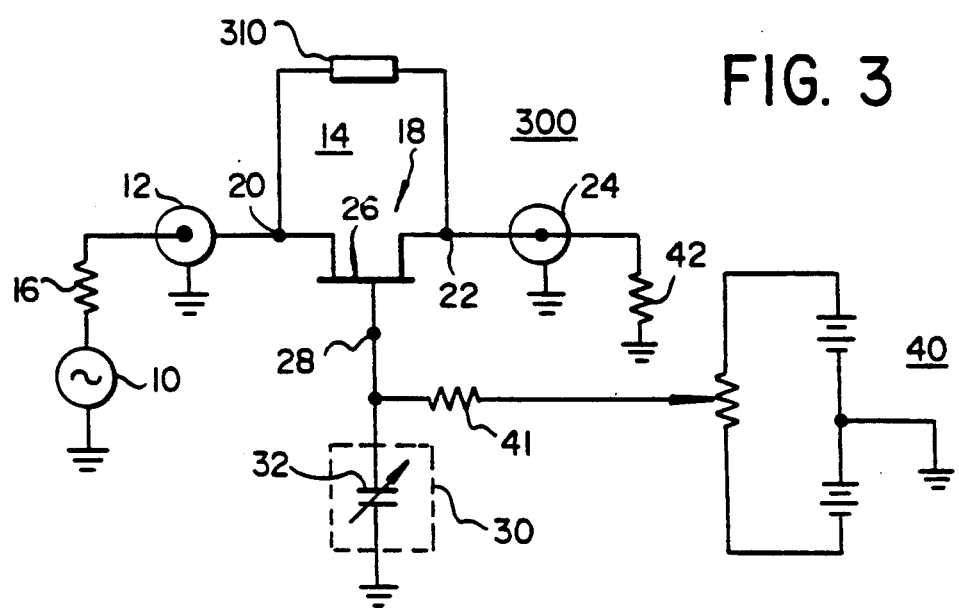
FIG. 3 is a simplified schematic diagram of a distortion generator in accordance with the invention, in which the FET source-to-drain path is bridged by an impedance.

FIG. 3 is a simplified schematic diagram of a distortion corrector, equalizer or compensator 300 in accordance with the invention. In FIG. 3, elements corresponding to those of FIG. 1 are designated by like reference numerals. FIG. 3 differs from FIG. 1 only in that a linear impedance illustrated as a block 310 is bridged from source electrode 20 to drain electrode 22, across controlled path 26. Controlled path 26 of FET 14 is effectively coupled as a voltage divider with load 42. In the presence of bridging impedance 310, two paths exist for the flow of signal from source 10 to load 42, a first non-linear path through controlled path 26, and a second linear path by way of impedance 310. It should particularly be noted that, as FET 26 is operated essentially without source-to-drain bias, and its source and load impedances (16 and 42) are ordinarily equal, it does not act as an amplifier. Therefore, impedance 310 is not a feedback impedance, but rather might be styled a "parallel" or "feedforward" impedance.

It has been discovered that, when impedance 310 of FIG. 3 is an inductance, the phase control can be used over a broader frequency band. This may be understood by considering that the phase angle of the signal passing through the FET at high power levels, represented by plot 216 of FIG. 2, is principally capacitive (i.e. the signal passing through the FET is phase advanced). At low signal power levels, the phase angle at frequencies above 11 Ghz is less capacitive, and even becomes slightly inductive (phase lag) at frequencies above about 12 Ghz. At frequencies below 11 GHz, the signal exiting the FET at low input power is phase advanced relative to that at high input power levels. When the FET path is bypassed by an inductive impedance 310 as in FIG. 4, at high signal power (low FET loss), the component of the signal which is contributed by the inductance is small in amplitude relative to the component passing through the FET, and makes little difference to the net phase angle, which remains advanced. At low signal power (high FET loss), the phase advanced signal contributed by the FET is reduced in amplitude, whereby the phase delayed component contributed by the inductance becomes relatively larger, and the net signal is thereby phase retarded or delayed.

Figure 4:
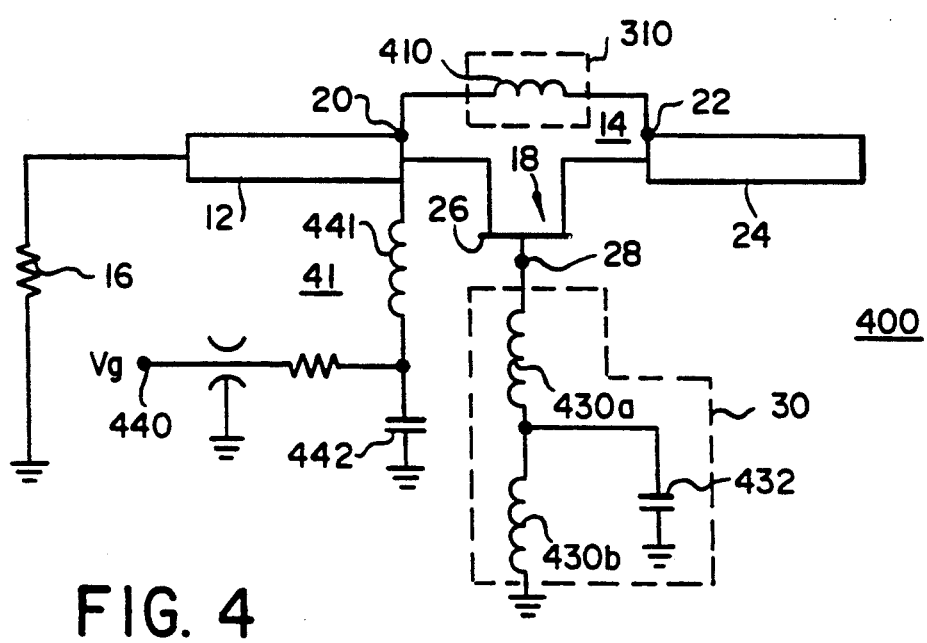
FIG. 4 is a simplified block diagram of the arrangement of FIG. 3 in which the bridging impedance is an inductor.
Figure 5:
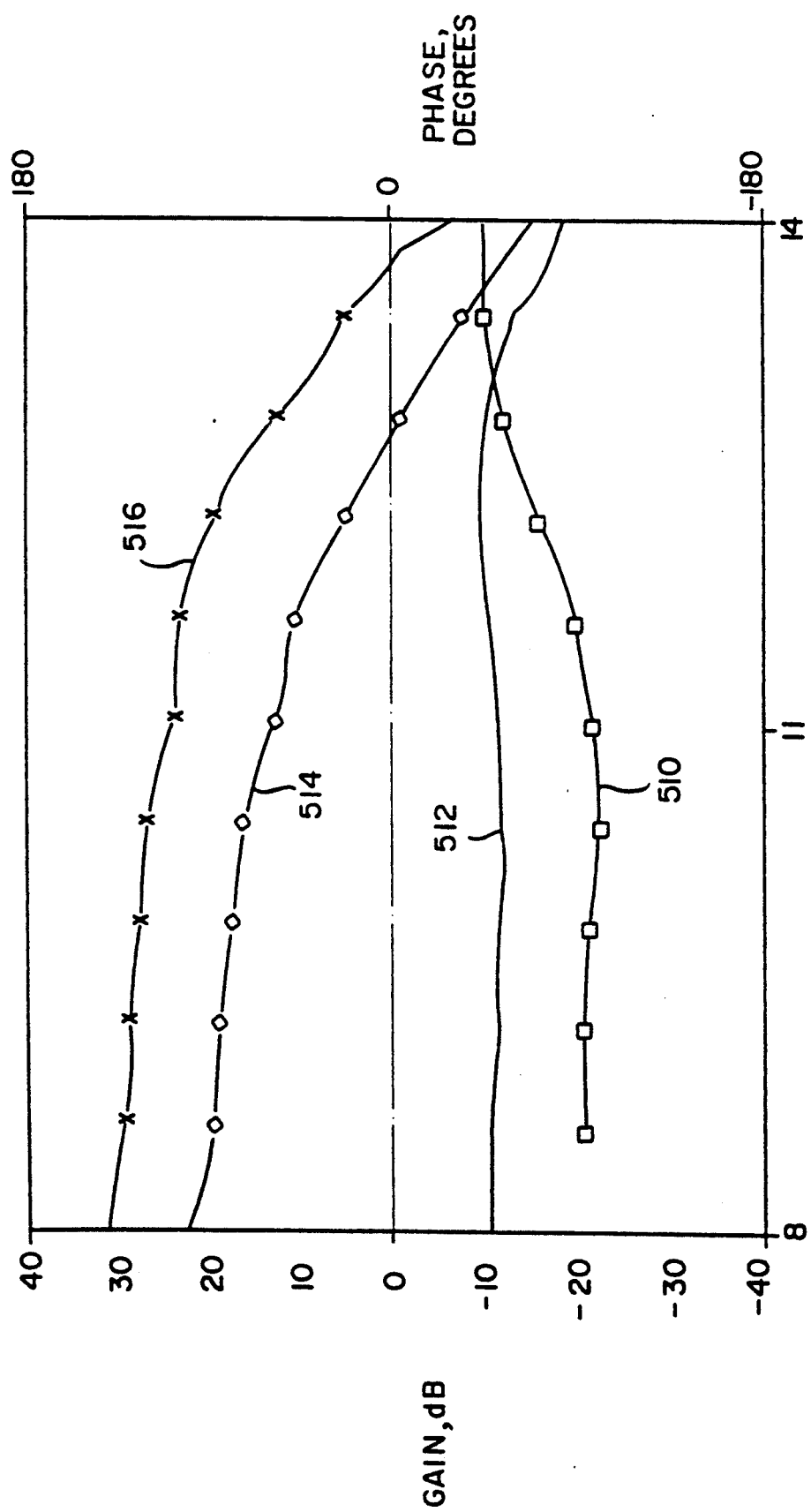
FIG. 5 plots computer-generated amplitude and phase responses of the FET distortion generator of FIG. 4 as a function of signal amplitude over a frequency range of 8 to 14 GHz.

FIG. 4 is a simplified schematic diagram of a distortion generator 400 in accordance with the invention. In FIG. 4, elements corresponding to those of FIGS. 1 and 3 are designated by the same reference numerals. As illustrated in FIG. 5, the input and output transmission lines are strip transmission lines of the type well known in the art and often referred to as "microstrip", which is used for microwave integrated circuits or monolithic microwave integrated circuits (MMICs). Within gate-to-ground impedance block 30 of FIG. 4, the impedance includes two series-connected inductors 430a and 430b with a juncture 432 therebetween, and a capacitor 434 connected from the juncture to ground. Bridging impedance 310 is an inductor 410 connected between source electrode 20 and drain electrode 22. The decoupling impedance, designated generally as 41, includes radio-frequency choke (RFC) 541, a shunt or decoupling capacitor 542 to ground, a resistor 544, and a feed-through capacitor 546. The term radio-frequency refers generally to any frequency above about 50 kHz which is capable of being radiated, and in relation to the described embodiments refers to microwave and millimeter-wave. A gate source voltage Vg is applied a bias voltage terminal 540 from a source (not illustrated).

In a particular embodiment of the invention, inductors 430a and 430b of FIG. 4 are each half-loops (i.e. similar to a Greek letter $\Omega$) of 0.0007 inch diameter (0.7 mil) conductive wire, each with wire length of 10 mils. The actual inductance of such inductors is difficult to determine because the area included within the entire circuit loop contributes to the inductance, so the inductance depends not only upon the half-loop "inductor" but also on the layout of the associated circuit. Capacitor 432 has a value of 0.1 pF, and is used principally as a tie point for inductors 530. In this same embodiment, shunt inductor 510 consists of three similar half-loops connected in parallel to thereby simulate a single large-diameter conductor, to thereby decrease the total inductance. Each of the three half-loop conductors comprising inductor 510 have 0.7 mil diameter and a wire length of 12 mils. The FET is a Nippon Electric GaAs type NE673.

Plot 516 of FIG. 5 represents the calculated net phase response of the arrangement of FIG. 4 at the same high input power level of 0 dBm as that of plot 216 of FIG. 2. At low input signal power, on the other hand, the contribution by inductive shunt or bridging impedance 310 causes a significant change in the net phase. The effect of the shunt inductance at low signal levels is to move the phase plot represented by 214 of FIG. 2 in the negative phase direction (i.e. a phase lag), resulting in a net phase shift represented as plot 514 of FIG. 5. As illustrated in FIG. 4, this change in phase between the high and low signal levels, as represented by plots 514 and 516, is relatively constant across the entire 8 to 14 GHz frequency band. The amplitude expansion in the presence of the shunt inductance, represented in FIG. 5 by low-power plot 510 and high-power plot 512, is substantially unchanged from that represented by plots 210 and 212 of FIG. 2. Thus, the inductive bridging impedance results in a broad frequency range over which more consistent phase performance is achieved, without significant effect on the gain.

Figure 6A:
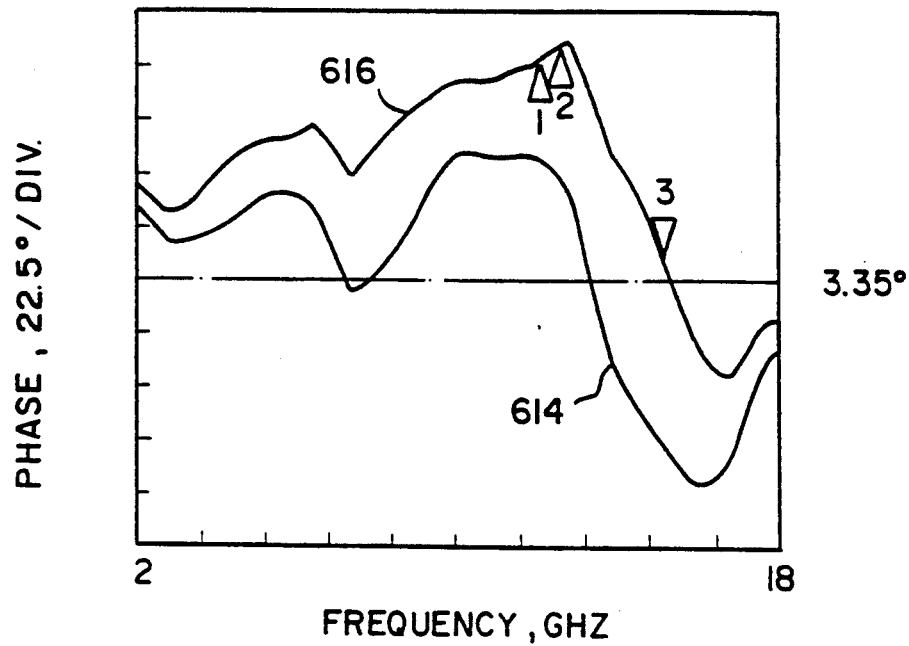
FIGS. 6a and 6b are plots of phase and amplitude responses, respectively, measured on a distortion generator as in FIG. 4, over a range of 2 to 18 GHz.
Figure 6B:
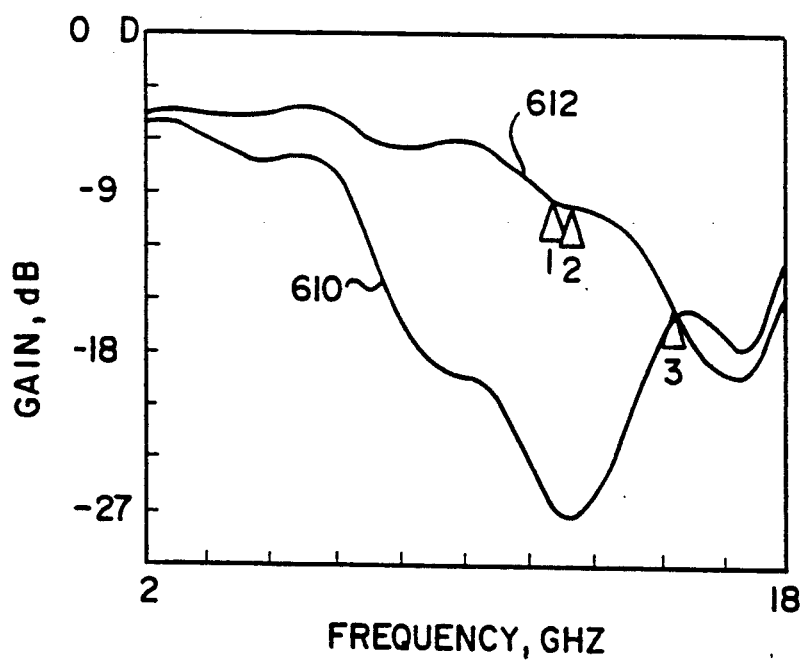

FIG. 6a plots measured phase of the distortion generator of FIG. 4 over the frequency range of 2 to 18 Ghz, with signal input amplitude as a parameter. The gate bias is about $-0.95$ volts. Markers 1 and 2 define 11 and 13 GHz, respectively. Marker 3 is the frequency at which gain crossover occurs, as described below. In FIG. 6a, plot 614 represents a low signal power level of $-25$ dBm input power, and plot 616 represents the high input power level of 0 dBm. As illustrated, the difference in phase angle between the high and low power levels remains relatively constant over broad frequency ranges. FIG. 6b plots measured amplitude response of the structure of FIG. 4 over the frequency range of 2 to 18 GHz for the same low (plot 610) and high (plot 612) signal amplitudes. Gain expansion occurs over the frequency range from 2 GHz to marker 3, which is at about 15 GHz. The gain expansion in the range 2-15 GHz, together with increasing phase angle with increasing signal power level, is desirable for compensating the amplitude compression and decreasing phase angle with increasing signal power exhibited by some amplifiers including traveling-wave tube amplifiers.

Figure 7A:
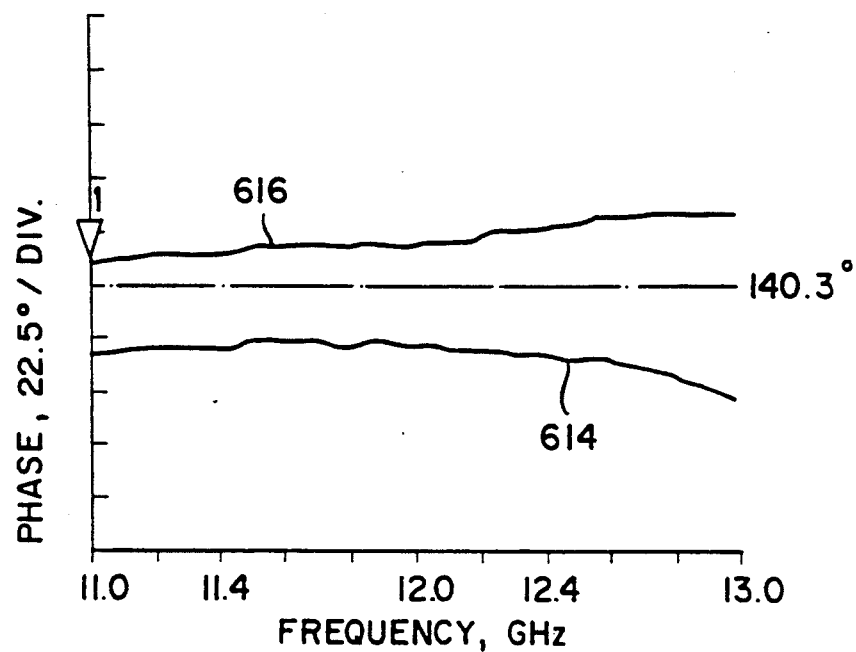
FIGS. 7a and 7b are plots corresponding to those of FIGS. 6a and 6b, respectively, measured over the frequency range 11 to 13 GHz.
Figure 7B:
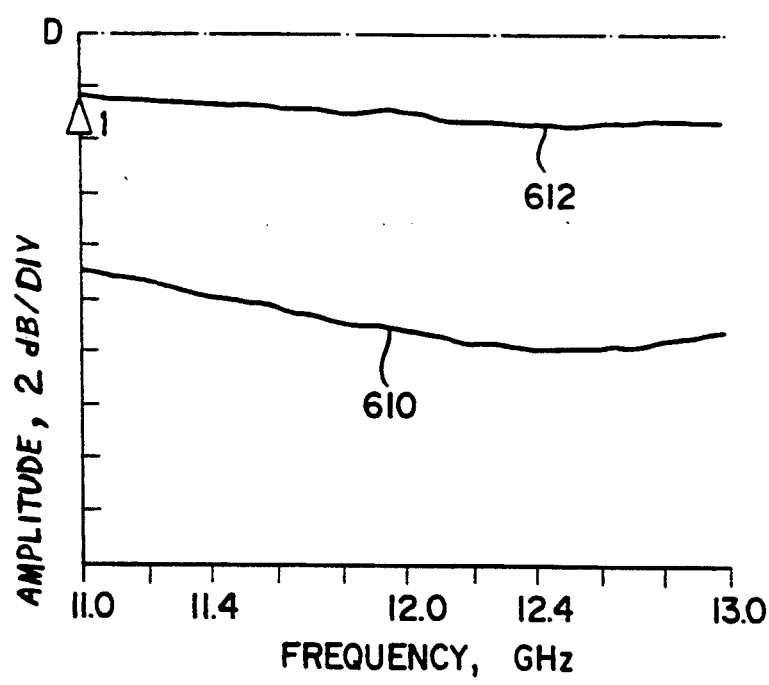

FIGS. 7a and 7b are expanded portions of plots 6a and 6b, illustrating details of the response in the frequency range of 11 to 13 GHz. Since the plots of FIGS. 7a and 7b are the same as those of FIGS. 6a and 6b, respectively, the same reference numerals are used. Also, the high power level is 0 dBm and the low power level is $-25$ dBm, as in FIGS. 6a and 6b. Performance such as that illustrated is useful in helping to compensate distortion over at least some frequency bands used in satellite communications. Of course, other types of FETs and other inductors may provide suitable performance over other frequency ranges. Absolute phase has *no* meaning. It is moved "all over" using phase offset control to keep display on the screening.

Figure 8B:
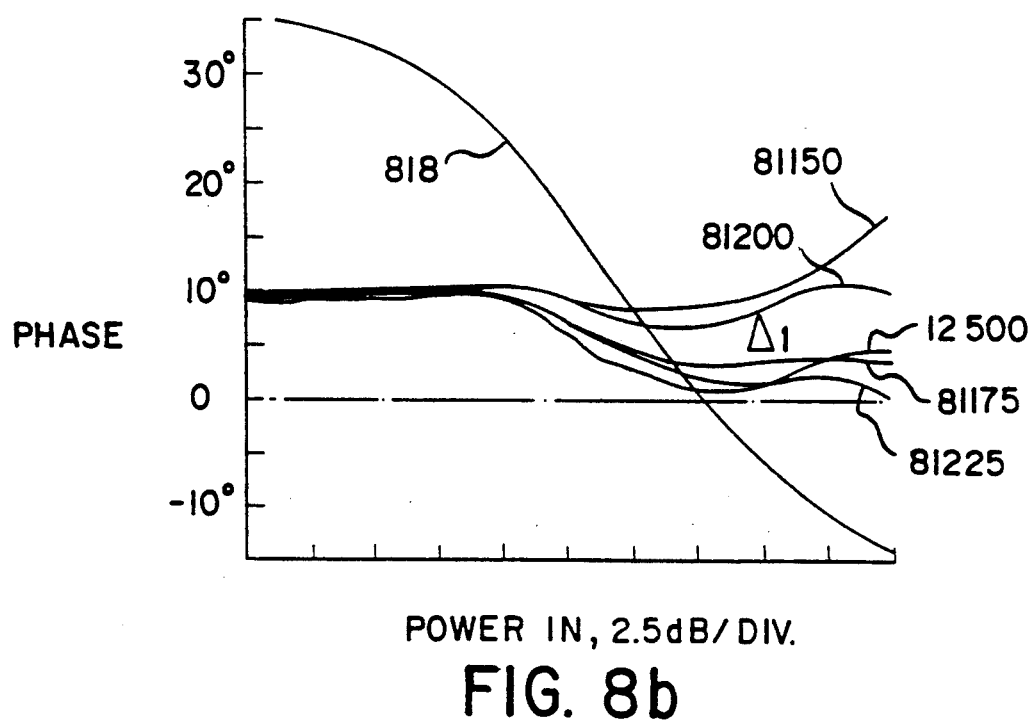
FIGS. 8b and 8c are plots of measured phase and amplitude response, respectively, of a cascade similar to that of FIG. 8a traveling-wave tube amplifier with a predistortion equalizer.
Figure 8C:
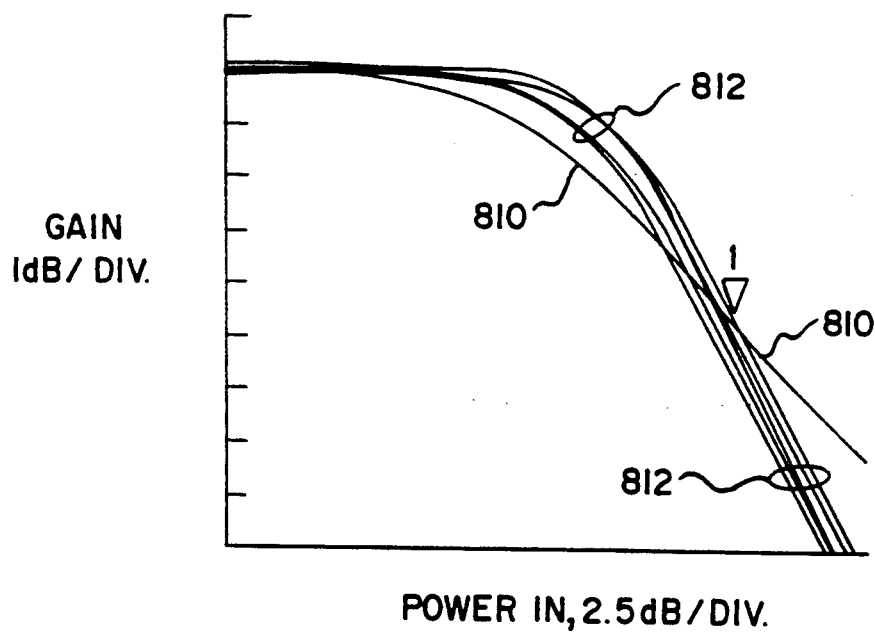
Figure 8A:
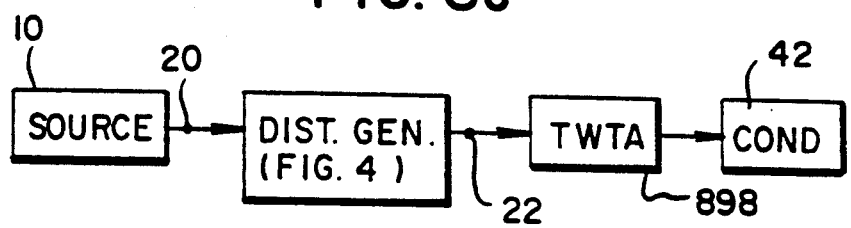
FIG. 8a is a simplified block diagram of the predistortion equalizer of FIG. 4 cascaded with a traveling wave tube amplifier.

FIG. 8a is a simplified block diagram of a TWT amplifier (TWTA) 898 cascaded with a predistortion equalizer 400 similar to that of FIG. 4, both coupled between source 10 and load 42. FIG. 8b illustrates plots of the phase response versus signal output amplitude of the arrangement of FIG. 8a with a TWTA alone, and the TWTA together with a distortion generator as in FIG. 8a. FIG. 8c illustrates the amplitude response of the TWTA alone and with the predistortion equalizer. Plot 818 of FIG. 8b represents the phase response of the TWTA alone. As illustrated, the phase of the TWTA begins at 0° reference value at low signal amplitude, and progressively becomes more negative with increasing input signal level, for a total phase change of about 50° over the illustrated amplitude range. Plots 81150, 81175, 81200, 81225 and 81250 represents the distortion-compensated phase versus signal input amplitude at 11.50, 11.75, 12.0, 12.25 and 12.5 GHz, respectively. As illustrated, the plots representing compensated phase are congruent and constant at a reference value −25° at lower levels, and no frequency plot deviates more that about 10° from the reference value during excursions from minimum to maximum power. This is a significant improvement in phase performance over the TWTA alone.

FIG. 8c illustrates a plot 810 of output signal amplitude versus input signal amplitude (compression or gain plot) for the abovementioned TWTA alone, and a group of plots, designated together as 812, represents corresponding plots at differing frequencies with the TWTA corrected by predistortion apparatus 400 of FIG. 4. In FIG. 8c, marker 1 identifies the saturation power point of the TWT, which is the input power point which produces maximum output power, and above and below which the output power decreases. As illustrated in FIG. 8c by plot 810, the TWTA alone goes into gradual compression beginning about 15 dB below the saturation point, and reaches about 1 dB compression about eight dB below saturation. Distortion-corrected plots 812 are still almost linear at this power level, representing a gain of about seven dB of linear operating level by comparison with the TWTA alone.

Figure 9:
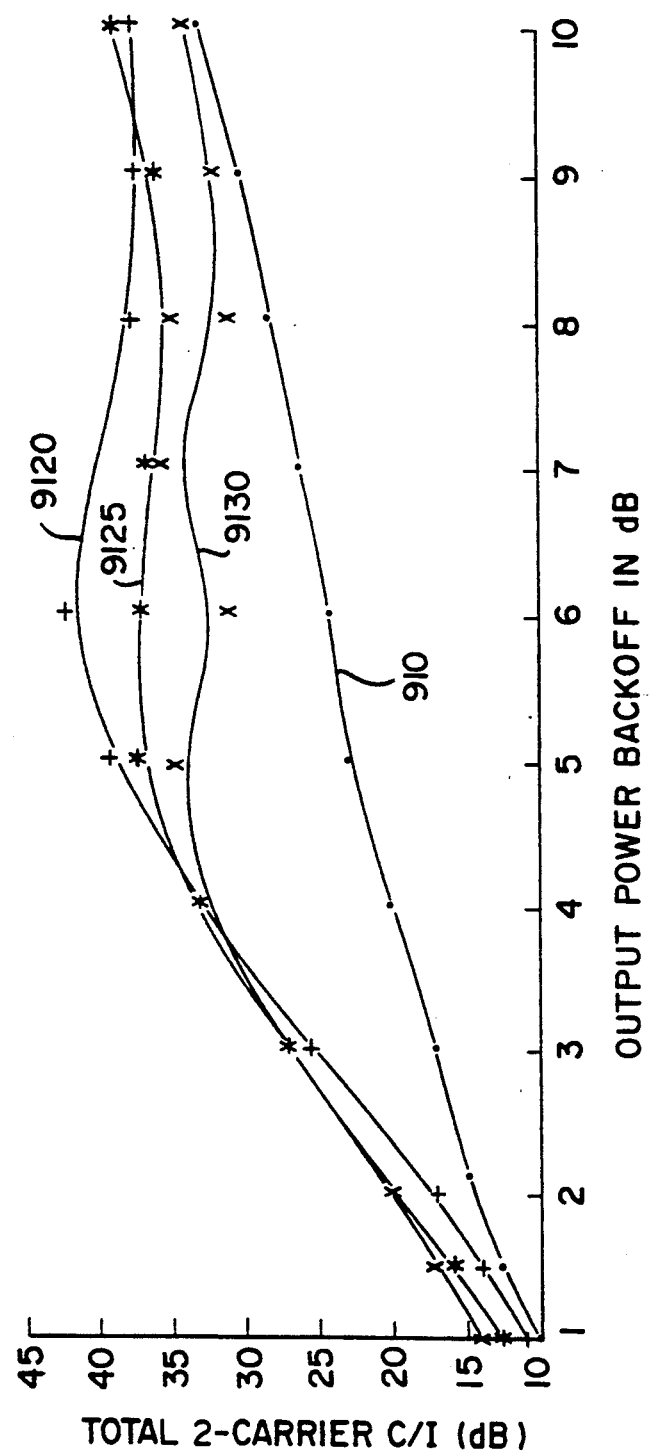

FIG. 9 plots two-carrier carrier-to-intermodulation (C/I) ratio versus signal level or power backoff from the single-carrier saturation of the TWTA with frequency as a parameter. In FIG. 9, plot 910 represents the performance of a TWTA at 12 GHz, while plots 9120, 9125, and 9130 represent the C/I ratio at 12, 12.5 and 13.0 GHz, respectively, for the TWTA cascaded with a predistortion equalizer according to FIG. 4. Higher C/I ratios represent better performance. As illustrated in FIG. 9, power backoff of 4 dB reduces the C/I ratio of the TWTA alone 20 dB, while the predistortion compensated TWTA has C/I ratio greater than 32 dB. This is an improvement in C/I ratio of 12 dB, over a 16 GHz range, attributable to the distortion compensator. Several dB of C/I ratio improvement is provided by the predistortion compensator at all frequencies in the 12 to 13 GHz range, at all amounts of backoff to 10 dB.

Figure 10A:
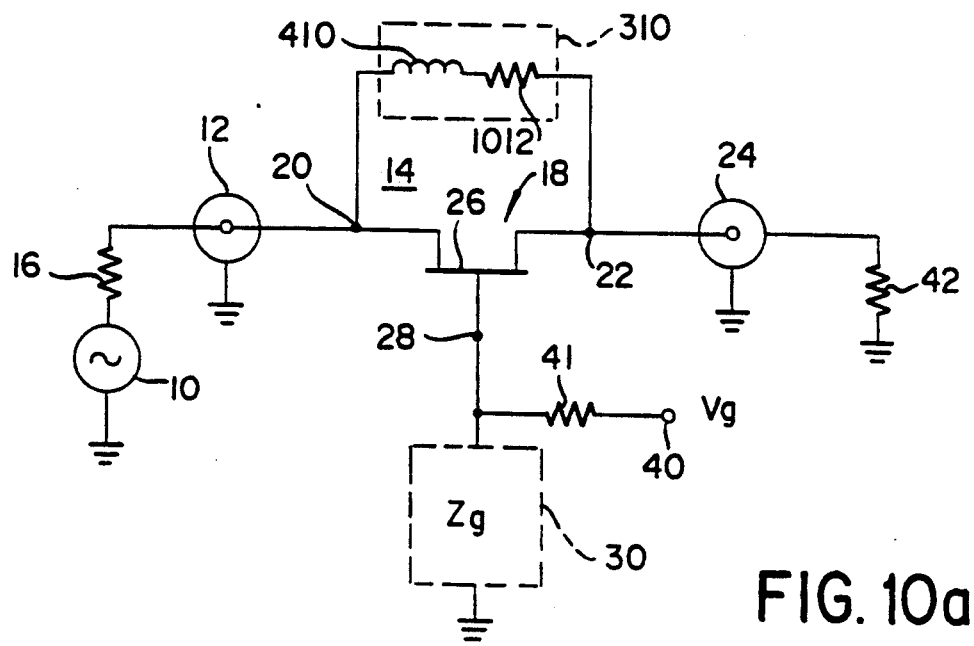
FIG. 10a is a simplified schematic diagram of a distortion generator in accordance with the invention in which a resistor is serially coupled with an inductor to form a series combination, and the series combination is bridged across the controller current path of a FET
Figure 10B:
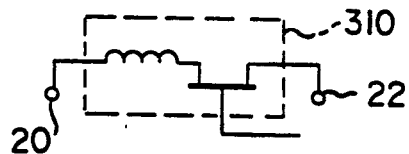
FIG. 10b is a simplified schematic diagram of the series combination of an inductor with a FET, in which the FET is a controllable resistor.

It has been discovered that independent control of amplitude and phase changes can be achieved. When bridge impedance 310 of FIG. 2 includes an inductance in series with a resistance, the magnitude of the resistance can control the magnitude and direction of the change in phase shift. FIG. 10 illustrates a distortion generator similar to that of FIG. 4, in which bridge impedance 310 includes an inductor 510 in series with a resistor 1012. As modeled and calculated (not illustrated), the phase change as a function of power level reaches zero at a resistor 1012 value of about 300 ohms. This value of resistance has negligible effect on the change of gain as a function of signal level.

It has also been discovered that, when bridge impedance 310 of FIG. 4 is an inductance, the change in gain or compression as a function of signal level can be adjusted without significantly affecting the change in phase. When the value of bridge or shunting inductance 510 is very small, it acts essentially as a short-circuit which bypasses the nonlinear FET conducting path 26. As a consequence, for very small values of inductance, the change of gain as a function of signal level or the nonlinearity of the distortion generator as a whole becomes small. When the bridging inductance is large, a relatively large amount of the signal flows through the nonlinear FET path rather than through the linear inductor, with the result that the nonlinearity of the distortion generator as a whole tends to be large. By judicious selection of the inductance value, various amounts of nonlinearity can be established.

Figure 11:
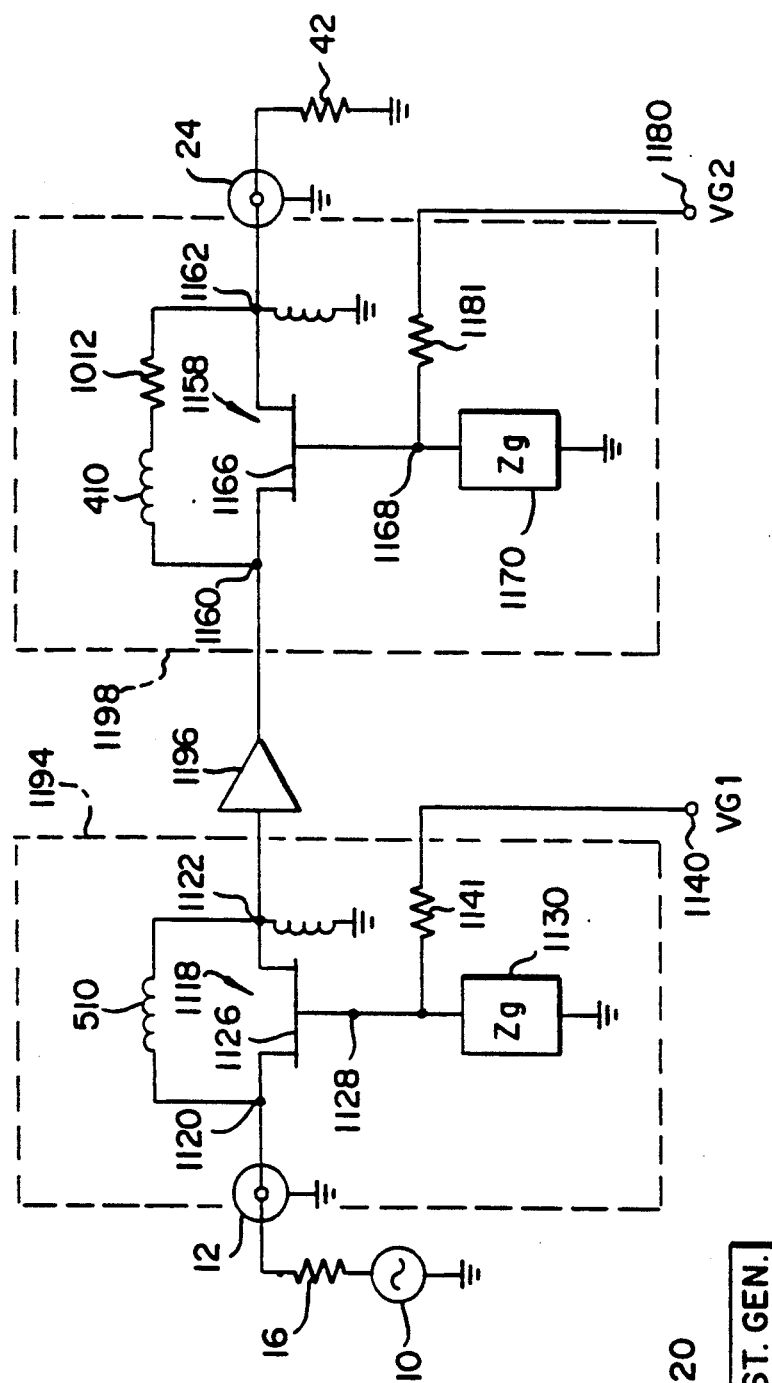
FIG. 11 is a simplified schematic diagram of a cascade of two distortion generators, one principally arranged for phase control as a function of signal level, and the other arranged for compression or amplitude control.

FIG. 11 is a simplified schematic and block diagram of a cascade of distortion generators, one principally for controlling the amount of amplitude distortion, the other for controlling the amount of phase distortion. In FIG. 11, signal generator 10 with internal impedance 16 drives a phase controlling nonlinear or distortion generator 1194. the phase-distorted output of generator 1194 is applied through an intermediate amplifier 1196 to compensate for the loss of distortion generator 1194, and the restored-amplitude signal is applied to an amplitude distortion compensating generator 1198. The phase and amplitude distorted signal at the output of distortion generator 1198 is applied to the utilization apparatus, illustrated as a load resistor 42. Ordinarily, the load will be a power amplifier.

Phase distorting generator 1194 is similar to the arrangement of FIG. 4, and reference numerals are the same as those of FIG. 4, but in the 1100 series. The bridge inductor is adjusted to minimize the change in gain as a function of signal amplitude. As mentioned, this still allows change of phase with changes of signal amplitude. The gate of FET 1118 of FIG. 11 is biased from a first controllable voltage source (not illustrated) which produces a gate voltage $V_{G1}$ selected to optimize the phase change as a function of signal amplitude.

Amplitude distorting generator 1198 is similar to the generator of FIG. 10. In generator 1198, a FET 1158 has a controlled current path 1166 extending from a source electrode 1160 to a drain electrode 1162, and also has a gate electrode 1168. An impedance 1170 extends from gate 1168 to ground. Gate electrode 1168 is biased from a source (not illustrated) by way of a terminal 1180 and isolation impedance 1181. The series combination of an inductor 410 and a resistor 1012 is bridged across controlled path 1166. Resistor 1012 is adjusted to minimize changes in phase as a function of signal amplitude, while inductor 410, gate impedance $Z_g$ and voltage $V_{G2}$ are adjusted to optimize the amplitude distortion.

Figure 12A:
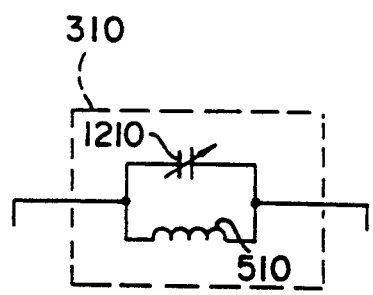
FIG. 12a illustrates, in simplified form, an alternative impedance which can be used in place of an impedance of FIG. 3.
Figure 12B:
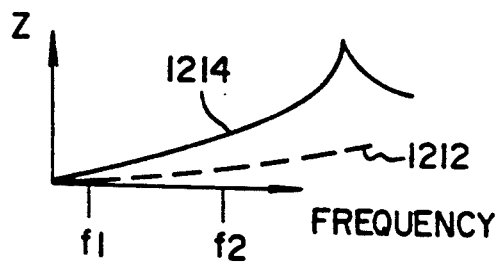

FIG. 12a is a schematic diagram of a bridging impedance 310 including an inductor 510 as in FIG. 4, and further including a capacitance in the form of a variable capacitor 1210 coupled across the inductor, to thereby form a parallel resonant circuit for bypassing the FET (not illustrated). FIG. 12b plots impedance Z versus frequency of the circuit of FIG. 12a. In FIG. 12b, dashed plot 1212 represents the impedance of inductor 510 alone. If a larger effective inductance is desired over an operating frequency range $f_1$ to $f_2$, variable capacitor 1210 of FIG. 12a is adjusted to parallel-resonate inductor 510 somewhat above frequency $f_2$, to present an impedance across its terminals which is illustrated as plot 1214 of FIG. 12b. At frequencies below resonance, including the operating frequency band $f_1$ to $f_2$, the inductance of inductor 510 has a lower impedance than does the capacitance of capacitor 1210, and therefore the current through bridging impedance 310 flows principally through inductor 510, and the net impedance of the parallel resonant circuit is therefore inductive. Thus, the effective inductance of a bridging inductor can be increased by parallel-resonating it at a frequency above the frequency band of interest. Naturally, such a parallel-resonant circuit, being effectively a single inductance, may be placed in series with a resistor for purposes described above. FIG. 12c represents the substitution of a voltage-variable capacitor 1280 for capacitor 1210.

Figure 13:
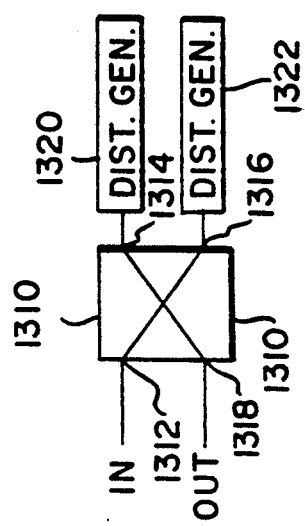
FIG. 13 is a simplified block diagram of a reflective distortion generating system using distortion generators in accordance with the invention.

FIG. 13 is a simplified block diagram of a distortion generator in accordance with the invention, used in a reflective mode. In FIG. 13, a 3 dB, 90° directional coupler 1310 includes an input port 1312, which couples to output ports 1314 and 1316. A first distortion generator according to the invention, designated 1320, is coupled to port 1314, and a second such distortion generator, designated 1322, is coupled to port 1316. The second or output RF ports of each generator 1320, 1322 are short-circuited to ground. Thus, one of the source and drain electrodes of distortion generators according to the invention are coupled to an output port 1314, 1316 of directional coupler 1310, and the other electrode is coupled to ground. The desired distorted signal output is taken from port 1318 of directional coupler 1310.

Figure 14:
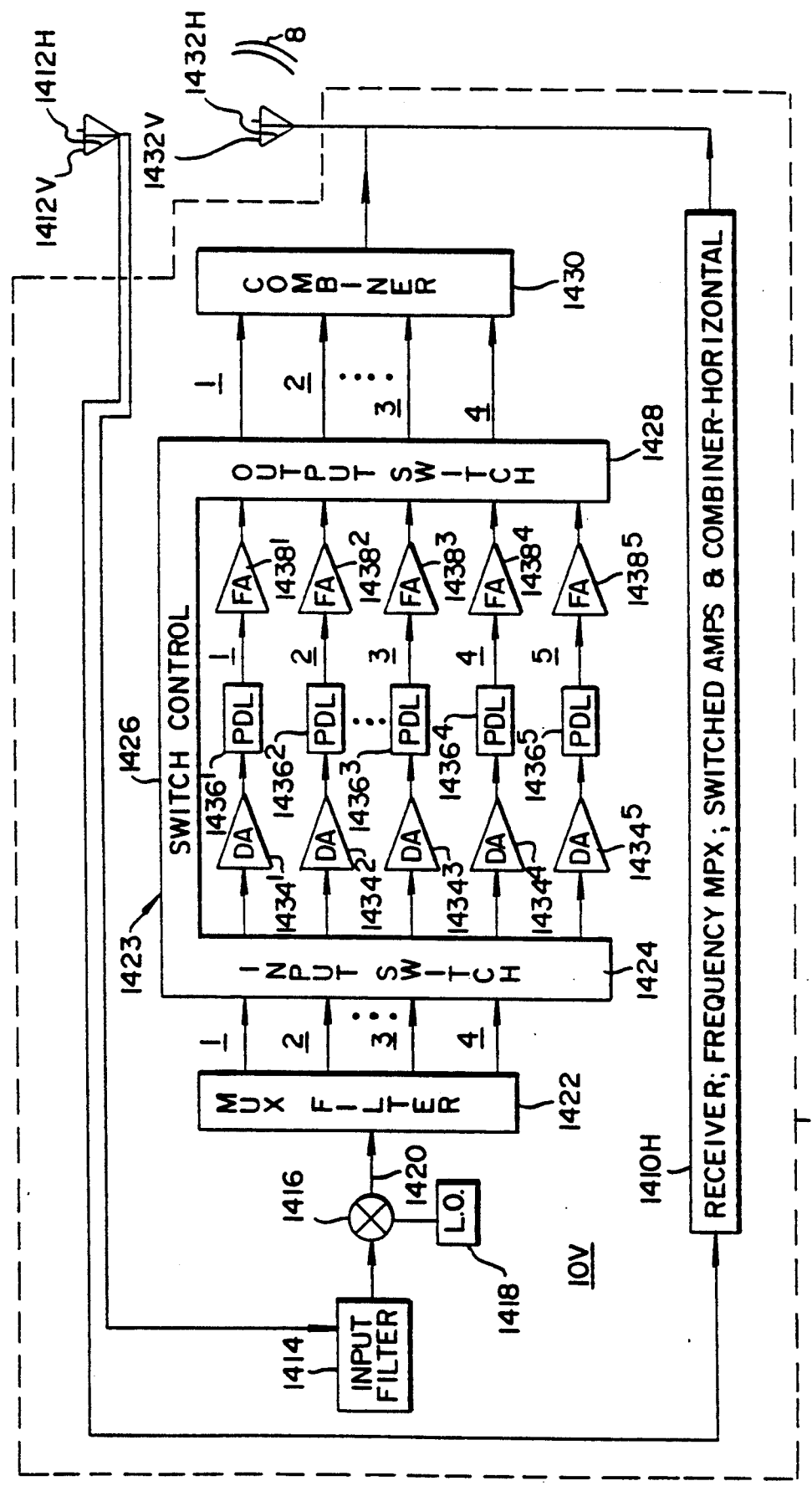
FIG. 14 is a general block diagram of a satellite with a multichannel communication system using predistortion generators in accordance with the invention.

FIG. 14 is a simplified general block diagram of a satellite multichannel communication system. In FIG. 14, a satellite body 1406 has thereupon a polarizing grid arrangement 1408, vertically polarized receiving antenna 1412V and horizontally polarized receiving antenna 1412H. Receiving antennas 1412V and 1412H are coupled to vertical and horizontal signal processing arrangements 1410V and 1410H, respectively, located within body 1406. Signal processing arrangements 1410V and 1410H process the received signals to produce signals to be retransmitted, which are broadcast by transmitting antennas 1432V and 1432H, respectively. Signal processing arrangement 1410H is similar to vertical processing unit 1410V, so only processing 1410V is described.

The vertically-polarized signals arriving at antenna 1412V by way of polarizing grid 8 includes a plurality of signals centered at different frequencies as described in more detail in U.S. patent application Ser. No. 07/772,207 filed Oct. 7, 1991, in the name of Wolkstein. In a typical satellite system, there may be as many as 10 or more vertical (V) and 10 or more horizontal (H) channels, with their frequencies of operation interleaved. The bandwidth of a received signal may be sufficient to carry a television channel, or more. Thus, the bandwidth of a signal may be 6 MHz or more. Vertical processing channel 1410V of FIG. 14 may, as a consequence, receive 10 or more signals, each six or more MHz wide, which are separated from each other by a like amount. Thus, the total frequency bandwidth occupied by the vertical signals may be 120 MHz or more, calculated as $[10(V)+10(H)] \times 6$. The center frequency of the 120 MHz band may be, for example, at 14 GHz.

The 10 or more vertical signals received by antenna 1412V of FIG. 14 are coupled to an input filter 1414 of channel 1410V, for reducing noise and preventing interference. Filter 1414 is a bandpass filter with a bandwidth substantially equal to the total bandwidth of the vertical signals. The filtered signals are coupled from input filter 1414 to a low noise amplifier (not illustrated) if required, and then to a block converter including a mixer 1416 and a local oscillator 1418. The frequency of local oscillator 1418 is selected to convert the 14 GHz center frequency to some other center frequency, such as 12 GHz. The downconverted 12 GHz signals are applied over a transmission path 1420 to a multiplexing (MUX) filter 1422. Multiplexing filter 1422 separates the signals from each other in accordance with their frequencies. Multiplexing filter 1422 is the starting point for a plurality of separate channels designated generally as 1, 2, . . . 3, 4. If there are 10 vertical signals, then the number of channels in signals processor 10V is also 10. In effect, filter 1422 is a source of signals at a plurality of different frequencies, driving a like plurality of separate channels.

In general, the signals on channels 1, 2, . . . 3, 4 in FIG. 14 are amplified, the distortion generated due to the amplification is compensated, and the amplified and distortion corrected signals are applied to a combiner or demultiplexer 1430, which may be a filter similar to filter 1422 operated in reverse, or it might be a group of hybrid combiners which do not discriminate based upon frequency. The combined signals at the output of combiner 1430 are applied to a transmitting antenna 1432V for transmission back to an Earth station, or possibly to another satellite.

System considerations such as the signal strength of the signal available at the satellite, the receiving antenna gain, and the transmitting antenna gain and field strength required to reach the ground station establish the overall power gain which must be provided in each channel between receiving antenna 12V and transmitting antenna 32V.

Within any channel 1, 2, . . . 3, 4 of FIG. 14, the signal is processed by the cascade of a driver amplifier (DA) 1434, a distortion linearizer such as a predistortion equalizer (PDL) 1436, and a power amplifier or final amplifier (FA) 1438. For example, as illustrated in FIG. 14, the cascade of a DA 1434[1], PDL 1436[1], and FA 1438[1] processes the channel 1 signals, and a DA 1434[2], PDL 1436[2], and FA 1438[2] amplifies the signals for channel 2. As illustrated in FIG. 14, an additional cascade of a DA 1434[5], PDL 1436[5], and FA 1438[5] is connected in cascade, to define a supernumerary "channel" designated 5. Channel 5 is not connected for handling signal, but instead represents a reserve cascade which may be substituted into any of the other channels in which the cascade may become defective. To this end, connection between input filter 1422 and the inputs of the various channel cascades 1434, 1436, 1438 is provided by means of an input switch arrangement designated 1424, and connection between the outputs of final amplifiers 1438 and combiner 1430 is provided by an output switch arrangement designated as 1428. A switch control arrangement illustrated as 1426 gangs the input and output switches for simultaneous operation, and responds to signals in response to evidence of failure, generated on the ground or autonomously by control circuits with the spacecraft itself. Thus, in the event that the cascade of DA 14345[1], PDL 1436[1], and FA 1438[1] fails completely or becomes degraded, the reserve cascade including DA 1434[5], PDL 1436[5], and FA 1438[5] can be substituted therefor, with the cascade of DA 1434[1], PDL 1436[1], and FA 1438[1] being removed from on-line use. Naturally, additional redundant units may be provided, and if the number of failures should exceed the number of redundant units, the switching arrangement including 1424, 1426 and 1428 may move operable cascades from lower-priority uses to higher-priority uses. In order to be switchable to obtain this level of reliability, each cascade has an instantaneous frequency bandwidth covering the cumulative or total bandwidth of the vertical signals. Thus, a broadband linearizer such as that of the invention is preferentially used for PDLs 1436.

Other embodiments of the invention will be apparent to those skilled in the art. For example, any form of transmission line may be used to couple signal to and from the distortion generator. A plurality of FETs may have their controllable current paths paralleled for operation at high power levels by joining their like electrodes for simultaneous operation. While operation in a transmissive mode has been described, the structure of FIG. 3 or 10 may be operating in a reflective mode by short-circuiting the output to ground. Also, the source and drain connections of the FET may be reversed, if desired. For remote control of the operating characteristics of the distortion generator, variable capacitor 1210 of FIG. 12a may be implemented as a voltage-variable capacitance diode.

What is claimed is:

1. A circuit for, within a particular frequency range, distorting at least one of (a) amplitude and (b) phase of signal to be distorted, in response to the amplitude of said signal to be distorted, said circuit comprising:
   a FET including a gate electrode, and also including source and drain electrodes and a controllable path for the flow of signal therebetween;
   bias means coupled to said gate electrode and to at least one of said source and drain electrodes, for applying bias voltage to said gate electrode for controlling said FET for distortion of signals traversing said controllable path;
   reactance means coupled between said gate electrode and a point of reference potential, said reactance means being selected to have a range of values, within said frequency range, for coacting with said bias for controlling said FET for distortion of said signals traversing said controllable path;
   inductance means including first and second ends;
   first coupling means coupled to said inductance means and to said FET, for coupling said first end of said inductance means to said source and said second end to said drain, for providing a path for flow of said signal parallel to said controllable path; and
   second coupling means for coupling said signal to be distorted to one of said source and drain electrodes, for causing said signal to traverse said controllable path at least once, and for coupling the resulting distorted signal to utilization means.

2. A circuit according to claim 1, wherein said first coupling means comprises low resistance galvanic connections, whereby said inductance means is coupled to said source and drain electrodes by low impedances, and said source and drain electrodes are, at zero frequency, constrained to be at the same direct potential.

3. A circuit according to claim 1 wherein said second coupling means couples said signal to be distorted to said source electrode, and couples said drain electrode to said utilization means.

4. A circuit according to claim 1, wherein said inductance means includes a capacitor in parallel with an inductor, for generating a circuit parallel-resonant at a frequency, whereby the impedance of said parallel-resonant circuit is inductive below said frequency.

5. A circuit according to claim 1, wherein said first coupling means comprises resistance means.

6. A circuit according to claim 5 wherein the value of said resistance means is selected to minimize changes of phase shift in response to the power level of signals traversing said circuit.

7. A circuit for, within a particular frequency range, distorting at least one of (a) amplitude and (b) phase of signal to be distorted, in response to the amplitude of said signal to be distorted, said circuit comprising:
   a FET including a gate electrode, and also including source and drain electrodes and a controllable path for the flow of signal therebetween;
   bias means coupled to said gate electrode and to at least one of said source and drain electrodes, for applying bias voltage to said gate electrode for controlling said FET for distortion of signals traversing said controllable path;
   reactance means coupled between said gate electrode and a point of reference potential, said reactance means being selected to have a range of values, within said frequency range, for coacting with said bias for controlling said FET for distortion of said signals traversing said controllable path;
   impedance means including first and second ends, said impedance means having said first end coupled to said source electrode and said second end coupled to said drain electrode, for providing an alternate path for the flow of said signal between said source electrode and said drain electrode; and
   coupling means coupled to said signal to be distorted to one of said source electrode and said drain electrode, for causing said signal to traverse said controllable path and said alternate path to thereby generate distorted signal, and for coupling said distorted signal to utilization means.

8. A circuit according to claim 7, wherein said impedance means comprises inductance means.

9. A circuit according to claim 7, wherein said impedance means is linear.

10. A circuit according to claim 8, wherein said inductance means includes a capacitor in parallel with an inductor.

11. A circuit according to claim 7, wherein said impedance means comprises inductance means serially coupled with resistance means.

12. A circuit according to claim 11, wherein said resistance means has a value selected to minimize changes in phase shift in response to the power level of signals traversing said circuit.

13. A satellite, comprising:
    a body;
    antenna means mounted to said body for receiving signals to produce received signals, and for transmitting signals to be transmitted;
    signal processing and multiplexing means coupled to said antenna means for dividing said received signals to produce separate signals in a first plurality of independent channels;
    a second plurality of amplifier means;

switch means coupled to said signal processing and multiplexing means for associating one of said amplifier means with each of said channels for producing amplified signals;

signal combining means coupled to said switch means for demultiplexing said amplified signals to produce a combined signal to be transmitted, and coupled to said antenna means for causing said combined signal to be transmitted; and a plurality of distortion linearizers, each associated with one of said amplifier means, each of said distortion linearizers being, in at least one position of said switch means, coupled for linearizing signals in one of said channels, each of said distortion linearizers including:

(a) a FET including a gate electrode, and also including source and drain electrodes and a controllable path for the flow of signal therebetween;

(b) bias means coupled to said gate electrode and to at least one of said source and drain electrodes, for applying bias voltage to said gate electrode for controlling said FET for distortion of signals traversing said controllable path;

(c) reactance means coupled between said gate electrode and a point of reference potential, said reactance means being selected to have a range of values, within said frequency range, for coacting with said bias for controlling said FET for distortion of said signals traversing said controllable path;

(d) inductance means including first and second ends;

(e) first coupling means coupled to said inductance means and to said FET, for coupling said first end of said inductance means to said source and said second end to said drain, for providing a path for flow of said signal parallel to said controllable path; and (f) second coupling means for coupling said signal to be distorted to one of said source and drain electrodes, for causing said signal to traverse said controllable path at least once, and for coupling the resulting distorted signal to utilization means.

14. A satellite according to claim 13, wherein said first plurality is less than said second plurality.

15. A satellite according to claim 13, wherein each of said distortion linearizers is coupled in its own channel between (A) said signal processing and multiplexing means, and (B) said amplifier means associated with said own channel.

16. A satellite according to claim 13, wherein each of said distortion linearizers is uniquely associated, in all positions of said switch means, with a corresponding one of said amplifier means.

* * * * *